(12) United States Patent
Qui et al.

(10) Patent No.: US 11,804,840 B2
(45) Date of Patent: Oct. 31, 2023

(54) INTEGRATED CIRCUIT WITH SELF-REFERENCE IMPEDANCE

(71) Applicant: REALTEK SEMICONDUCTOR CORP., Hsinchu (TW)

(72) Inventors: Qing-Zhe Qui, Hsinchu (TW); Can Quan, Hsinchu (TW); Su-Hang Chen, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 5 days.

(21) Appl. No.: 17/681,920

(22) Filed: Feb. 28, 2022

(65) Prior Publication Data

US 2023/0141008 A1 May 11, 2023

(30) Foreign Application Priority Data

Nov. 11, 2021 (CN) .......................... 202111334532.5

(51) Int. Cl.
*H03K 19/00* (2006.01)
*H03H 11/28* (2006.01)
*H01L 23/64* (2006.01)

(52) U.S. Cl.
CPC ........... *H03K 19/0005* (2013.01); *H03H 11/28* (2013.01); *H01L 23/64* (2013.01)

(58) Field of Classification Search
None
See application file for complete search history.

(56) References Cited

U.S. PATENT DOCUMENTS

| 2004/0207451 | A1* | 10/2004 | Kitagawa et al. | ...... H03H 11/28 327/334 |
| 2010/0289462 | A1* | 11/2010 | Wu | .......... H03F 1/30 327/536 |
| 2018/0138895 | A1* | 5/2018 | Liu et al. | ................ G05F 3/262 |

FOREIGN PATENT DOCUMENTS

| TW | 201820784 A | 6/2018 |
| TW | 202007041 A | 2/2020 |

* cited by examiner

*Primary Examiner* — Anh Q Tran
(74) *Attorney, Agent, or Firm* — Birch, Stewart, Kolasch & Birch, LLP (57) ABSTRACT

An integrated circuit with self-reference impedance includes an input/output pin provided for connection to an external impedance, a local impedance, a reference power circuit, a switching circuit, and a control circuit. The switching circuit is configured to conduct a connection between the input/output pin and the reference power circuit in a first state and to conduct a connection between the local impedance and the reference power circuit in a second state. The control circuit is configured to detect whether the external impedance is connected to the input/output pin or not and to generate a detection signal. The control circuit controls the switching circuit into the first state or the second state according to the detection signal. In the first state, the reference power circuit generates a reference signal according to the external impedance. In the second state, the reference power circuit generates the reference signal according to the local impedance.

18 Claims, 3 Drawing Sheets

INTEGRATED CIRCUIT WITH SELF-REFERENCE IMPEDANCE

CROSS REFERENCE TO RELATED APPLICATION

This non-provisional application claims priority under 35 U.S.C. § 119(a) to Patent Application No. 202111334532.5 filed in China, P.R.C. on Nov. 11, 2021, the entire contents of which are hereby incorporated by reference.

BACKGROUND

Technical Field

The present invention relates to a reference power generation technology, and in particular to an integrated circuit with self-reference impedance to generate reference power.

Related Art

In many chips, devices, or circuits, reference power is required to embody certain functions. Therefore, a general chip, device or circuit generates reference power through an external resistor. However, the external resistor is susceptible to some noise disturbance. Furthermore, the external resistor will occupy space in a product formed by the chip, device or circuit, and increase the manufacturing cost of the product.

SUMMARY

In view of the above, the present invention provides an integrated circuit with self-reference impedance. According to some embodiments, the present invention can reduce the occupied area in the product formed by the chip, device or circuit and reduce the manufacturing cost of the product. According to some embodiments, the present invention can reduce the probability that the reference power is disturbed by noise.

According to some embodiments, the integrated circuit with self-reference impedance includes an input/output pin, a local impedance, a reference power circuit, a switching circuit and a control circuit. The input/output pin is provided for connection to an external impedance. The switching circuit is connected between the input/output pin, the local impedance and the reference power circuit, and configured to conduct a connection between the input/output pin and the reference power circuit in a first state and to conduct a connection between the local impedance and the reference power circuit in a second state. The control circuit is configured to detect whether the input/output pin is connected to the external impedance or not and to generate a detection signal. The control circuit controls the switching circuit into the first state or the second state according to the detection signal. When the switching circuit is controlled into the first state, the reference power circuit generates a reference signal according to the external impedance. When the switching circuit is controlled into the second state, the reference power circuit generates the reference signal as a reference power of the integrated circuit according to the local impedance.

Based on the above, according to some embodiments, the external impedance or the local impedance is selected to generate the reference signal, so that the generation of the reference signal may not be limited to a single manner. In some embodiments, the external impedance may be selected to generate the reference signal when the input/output pin is connected to the external impedance, so the area required by the circuit design of the integrated circuit can be reduced, and the manufacturing cost can be reduced. In some embodiments, the local impedance may be used to generate the reference signal, so the probability that the reference power is disturbed by noise can be reduced.

DETAILED DESCRIPTION

It may be understood that the terms "first", "second" and the like used in this specification may be used for describing various components in this specification rather than indicate a specific order of or limit the differences of the components, and are not intended to limit the scope of the present invention. Additionally, the terms such as "connect" refers to that the connection may be a direct and physical connection or an electrical connection; or the connection may be an indirect and physical connection or an electrical connection between two or more components. For example, in a case that a first device is connected to a second device described in this specification, the first device may be directly and electrically connected to the second device, or indirectly and electrically connected to the second device through another device or connection means.

Figure 1:
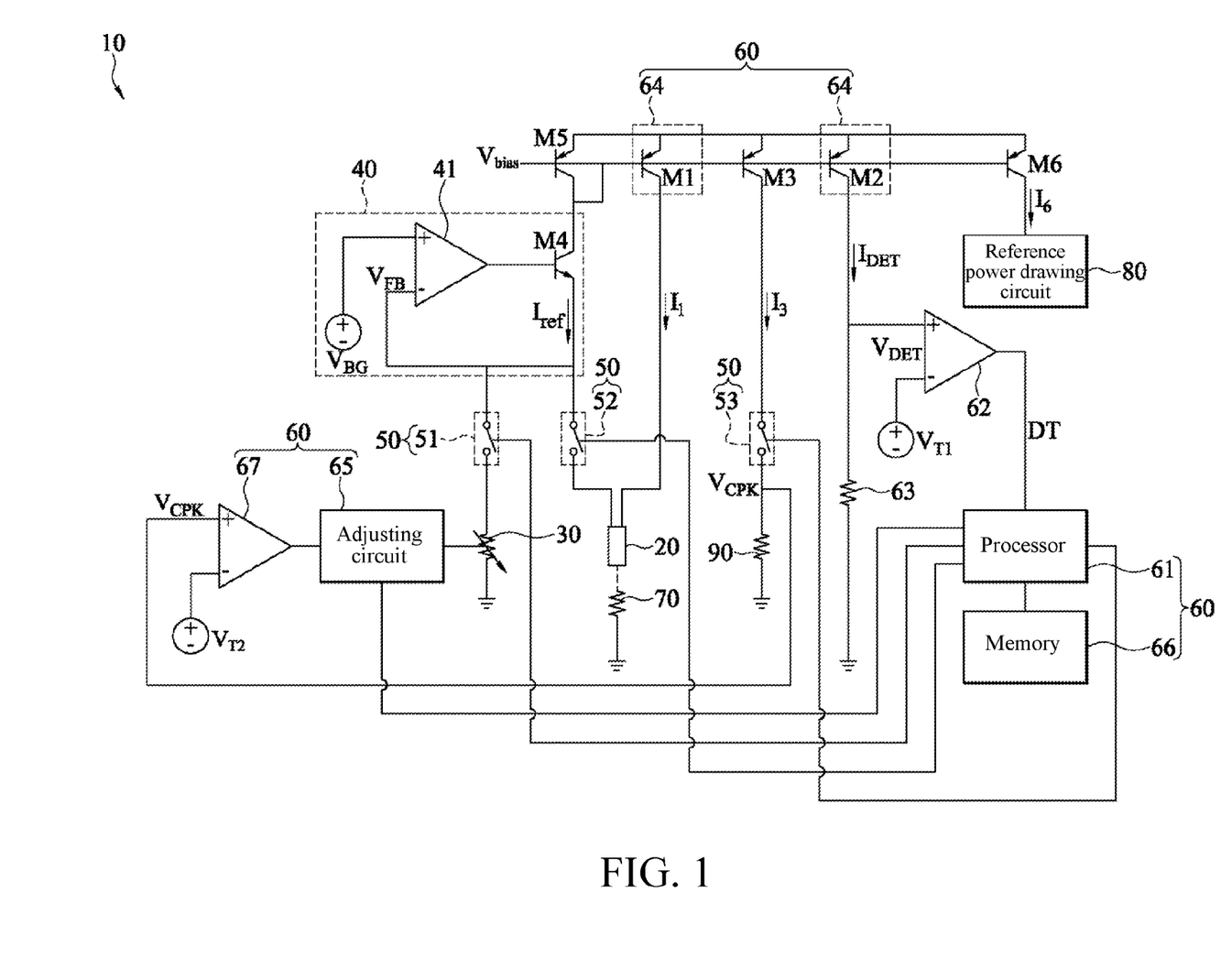
FIG. 1 is a schematic block diagram of an integrated circuit with self-reference impedance according to some embodiments of the present invention.

Referring to FIG. 1, which is a schematic block diagram of an integrated circuit with self-reference impedance 10 according to some embodiments of the present invention. The integrated circuit with self-reference impedance (hereinafter referred to as the integrated circuit 10) includes an input/output pin 20, a local impedance 30, a reference power circuit 40, a switching circuit 50 and a control circuit 60. The switching circuit 50 is connected between the input/output pin 20, the local impedance 30 and the reference power circuit 40. The control circuit 60 is connected with the input/output pin 20, the local impedance 30, the reference power circuit 40 and the switching circuit 50.

The input/output pin 20 is provided for connection to an external impedance 70. In some embodiments, the integrated circuit 10 is implemented by a chip. The external impedance 70 is located outside the chip, and the input/output pin 20 is an input/output pin of the chip. The local impedance 30, the reference power circuit 40, the switching circuit 50, and the control circuit 60 are located inside the chip. In some embodiments, the external impedance 70 and the local impedance 30 are further connected with a ground terminal. For example, a first terminal of the external impedance 70 and a first terminal of the local impedance 30 are connected with the ground terminal. A second terminal of the external impedance 70 is connected with the input/output pin 20, and a second terminal of the local impedance 30 is connected with the switching circuit 50. In other words, the external impedance 70 is connected between the input/ output pin 20 and the ground terminal, and the local impedance 30 is connected between the switching circuit 50 and the ground terminal.

In some embodiments, the external impedance 70 and the local impedance 30 may be formed by a passive component such as a resistor, a capacitor, an inductor and the like. In a preferred embodiment, the external impedance 70 and the local impedance 30 may be resistors. Although the external impedance 70 and the local impedance 30 are respectively represented by only one resistor symbol in FIG. 1, the present invention is not limited to this. The external impedance and the local impedance may include a plurality of resistors in series and/or in parallel according to actual design requirements.

In some embodiments, the local impedance 30 may be a resistor implemented by a metal oxide semiconductor (MOS) transistor, or a resistor implemented by a well area formed through ion implantation. In some embodiments, the local impedance 30 may be a poly resistor, for example, a resistor formed by a RPO layer, a P+ layer, a poly layer, a contact layer and a resdummy layer of the MOS transistor, so that the design area occupied by the local impedance 30 in the integrated circuit 10 can be saved, and the manufacturing cost can be reduced. In other words, the local impedance 30 may be implemented by some transistors in the integrated circuit 10 without additionally disposing other components for implementing the local impedance 30.

The control circuit 60 is configured to detect whether the input/output pin 20 is connected to the external impedance 70 or not and to generate a detection signal DT. Then, the control circuit 60 controls the switching circuit 50 into a first state or a second state according to the indication of the detection signal DT.

The switching circuit 50 conducts a connection between the input/output pin 20 and the reference power circuit 40 in the first state. When the switching circuit 50 is controlled into the first state, the reference power circuit 40 generates a reference signal according to the external impedance 70. The switching circuit 50 conducts a connection between the local impedance 30 and the reference power circuit 40 in the second state. When the switching circuit 50 is controlled into the second state, the reference power circuit 40 generates the reference signal according to the local impedance 30. Thereby, the generation of the reference signal may not be limited to a single manner. Furthermore, since the local impedance 30 may be used to generate the reference signal in some cases, the probability that the reference signal is disturbed by noise can be reduced. The reference signal is used as a reference power of the integrated circuit 10. For example, as shown in FIG. 1, the reference signal may be used as the reference power of a reference power drawing circuit 80 of the integrated circuit 10. The reference power drawing circuit 80 is configured to realize certain functions, such as an overload protection function of the integrated circuit 10. The reference power may be a reference voltage or a reference current (for example, a reference current $I_{ref}$ shown in FIG. 1).

In some embodiments, as shown in FIG. 1, the switching circuit 50 includes a plurality of switches 51-52. The switch 51 is connected between the reference power circuit 40 and the local impedance 30. The switch 52 is connected between the reference power circuit 40 and the input/output pin 20. In the first state, the switch 52 conducts the connection between the reference power circuit 40 and the input/output pin 20, thereby conducting the connection between the reference power circuit 40 and the external impedance 70. At this time, the switch 51 breaks (does not conduct) the connection between the reference power circuit 40 and the local impedance 30. In the second state, the switch 51 conducts the connection between the reference power circuit 40 and the local impedance 30. At this time, the switch 52 breaks (does not conduct) the connection between the reference power circuit 40 and the input/output pin 20, thereby breaking (not conducting) the connection between the reference power circuit 40 and the external impedance 70. The switches 51-52 may be implemented by electronic switches (for example, transistors).

In some embodiments, the control circuit 60 generates the detection signal DT indicating the first state and controls the switching circuit 50 into the first state when detecting that the input/output pin 20 is connected to the external impedance 70. The control circuit 60 generates the detection signal DT indicating the second state and controls the switching circuit 50 into the second state when detecting that the input/output pin 20 is not connected to the external impedance 70. In other words, the external impedance 70 is selected to generate the reference signal when the input/output pin 20 is connected to the external impedance 70. The local impedance 30 is used to generate the reference signal when the input/output pin 20 is not connected to the external impedance 70. Thereby, the area required for designing the integrated circuit 10 can be simplified, and the manufacturing cost can be reduced. For example, there is no need to reserve a space for the external impedance 70 on the integrated circuit 10.

In some embodiments, as shown in FIG. 1, the control circuit 60 includes a processor 61. The processor 61 is connected with the switching circuit 50. The switching of the state of the switching circuit 50 is controlled by the processor 61. For example, the processor 61 sends a switching signal and the detection signal DT indicates the first state when the switching circuit is in the second state, and the switching circuit 50 is switched from the second state to the first state in response to the switching signal. When the switching circuit is in the first state and the detection signal DT indicates the second state, the processor 61 sends the switching signal, and the switching circuit 50 is switched from the first state to the second state in response to the switching signal. In other words, when the state of the switching circuit 50 is different from the state indicated by the detection signal DT, the processor 61 sends the switching signal to make the switching circuit 50 switch the state. On the contrary, when the state of the switching circuit 50 is the same as the state indicated by the detection signal DT, the processor 61 does not send the switching signal so as to maintain the state of the switching circuit 50. The processor 61 may be an operational circuit such as a central processing unit, a microprocessor, an application-specific integrated circuit (ASIC) or the like.

In some embodiments, as shown in FIG. 1, the control circuit 60 includes a first comparator 62 and a pull-down impedance 63. The first comparator 62 is connected with the input/output pin 20 and the pull-down impedance 63. The first comparator 62 is configured to compare a detection voltage $V_{DET}$ with a first voltage threshold $V_{T1}$ to generate the detection signal DT. The detection voltage $V_{DET}$ varies according to the external impedance 70 and the pull-down impedance 63. In some embodiments, the first comparator 62 is further connected with the processor 61 to output the detection signal DT to the processor 61. In some embodiments, a first input terminal of the first comparator 62 is connected with the input/output pin 20 and the pull-down impedance 63, and an output terminal of the first comparator 62 is connected with the processor 61. In some embodiments, the first voltage threshold $V_{T1}$ may be a band gap reference voltage source generated by a band gap reference voltage generating circuit (not shown), and the band gap reference voltage source is connected with a second input terminal of the first comparator 62.

In some embodiments, the pull-down impedance 63 may be formed by a passive component such as a resistor, a capacitor, an inductor and the like. In a preferred embodiment, the pull-down impedance 63 may be a resistor. The resistor has a small resistance. For example, the pull-down impedance 63 may be a resistor of less than 5 Ω. Although the pull-down impedance 63 is represented by only one resistor symbol in FIG. 1, the present invention is not limited to this. The pull-down impedance may include a plurality of resistors in series and/or in parallel according to actual design requirements. In addition, the resistor may be implemented by an MOS transistor or by a well area formed through ion implantation.

In some embodiments, when the input/output pin 20 is connected to the external impedance 70, the detection voltage $V_{DET}$ is greater than the first voltage threshold $V_{T1}$. When the detection voltage $V_{DET}$ is greater than the first voltage threshold $V_{T1}$, the first comparator 62 generates the detection signal DT indicating the first state. For example, the first comparator 62 generates a high-level signal to indicate the first state.

In some embodiments, as shown in FIG. 1, the control circuit 60 includes a voltage divider circuit 64. The voltage divider circuit 64 is connected with the input/output pin 20, the first comparator 62 and the pull-down impedance 63. The voltage divider circuit 64 is configured to generate a detection current $I_{DET}$ according to the external impedance 70 when the input/output pin 20 is connected to the external impedance 70. The pull-down impedance 63 generates the detection voltage $V_{DET}$ greater than the first voltage threshold $V_{T1}$ according to the detection current $I_{DET}$, so that the first comparator 62 generates the detection signal DT indicating the first state. In some embodiments, the detection voltage $V_{DET}$ generated by the pull-down impedance 63 that is greater than the first voltage threshold $V_{T1}$ is equal to or approximate to a value obtained by multiplying the detection current $I_{DET}$ by the impedance value of the pull-down impedance 63.

In some embodiments, the pull-down impedance 63 is further connected with the ground terminal. For example, a first terminal of the pull-down impedance 63 is connected with the ground terminal, a second terminal of the pull-down impedance 63 is connected with the voltage divider circuit 64 and the first input terminal of the first comparator 62, and the pull-down impedance 63 generates the detection voltage $V_{DET}$ at the first input terminal of the first comparator 62. In other words, the pull-down impedance 63 is connected between the first input terminal of the first comparator 62 and the ground terminal and is connected between the voltage divider circuit 64 and the ground terminal.

In some embodiments, as shown in FIG. 1, the voltage divider circuit 64 includes a first transistor M1 and a second transistor M2. The first transistor M1 and the second transistor M2 may be a P-type MOS transistor or a P-type bipolar transistor. The description is made by taking the first transistor M1 and the second transistor M2 as P-type bipolar transistors. A collector of the first transistor M1 is connected with the input/output pin 20. An emitter of the first transistor M1 is connected with an emitter of the second transistor M2. A collector of the second transistor M2 is connected with the first input terminal of the first comparator 62 and the pull-down impedance 63 A base of the first transistor M1 and a base of the second transistor M2 respectively receive a bias voltage $V_{bias}$ from a bias circuit (not shown), so that the operation of the first transistor M1 and the operation of the second transistor M2 are started. Although the base of the first transistor M1 and the base of the second transistor M2 respectively receive a same bias voltage in FIG. 1, the present invention is not limited to this. The base of the first transistor M1 and the base of the second transistor M2 may respectively receive different bias voltages. When the input/output pin 20 is connected to the external impedance 70 and the first transistor M1 operates, the first transistor M1 generates an output current $I_1$ according to the external impedance 70. When the second transistor M2 operates, the second transistor M2 generates the detection current $I_{DET}$ according to the output current $I_1$, so that the first comparator 62 generates the detection signal DT indicating the first state.

In some embodiments, when the input/output pin 20 is not connected to the external impedance 70, the detection voltage $V_{DET}$ is pulled down by the pull-down impedance 63 to be not greater than the first voltage threshold $V_{T1}$. When the detection voltage $V_{DET}$ is not greater than the first voltage threshold $V_{T1}$, the first comparator 62 generates the detection signal DT indicating the second state. For example, the first comparator 62 generates a low-level signal to indicate the second state. Specifically, when the input/output pin 20 is not connected to the external impedance 70, a path between the pull-down impedance 63 and the voltage divider circuit 64 does not have the detection current $I_{DET}$. Therefore, the detection voltage $V_{DET}$ is pulled down by the pull-down impedance 63 to be identical to or approximate to a potential of the ground terminal. For example, the detection voltage $V_{DET}$ is pulled down to be 0 volt (V) or approximate to 0 volt (such as 0.1 volt). In some embodiments, when the input/output pin 20 is not connected to the external impedance 70, the pull-down impedance 63 may be used not only to generate the detection signal DT indicating the second state, but also to ensure that the first input terminal of the first comparator 62 is not floating.

In some embodiments, when the switching circuit 50 is controlled into the second state, the control circuit 60 adjusts an impedance value of the local impedance 30 in response to a correction signal. The local impedance 30 may be a variable impedance. In a preferred embodiment, the local impedance 30 may be a variable resistor. In some embodiments, the control circuit 60 generates the correction signal when the impedance value of the local impedance 30 is not consistent with an impedance target value. In other words, the correction signal is generated when the impedance value of the local impedance 30 needs to be changed. For example, it is assumed that the local impedance 30 is a poly resistor and the poly resistor is adjustable. The poly resistor may have a deviation of plus or minus 20%, resulting in the reference signal not being accurate enough (that is, the reference signal also has a deviation). Therefore, when the impedance value of the local impedance 30 is not consistent with the impedance target value (that is, the impedance value of the local impedance 30 deviates), the impedance value of the local impedance 30 is adjusted to generate an accurate reference signal (that is, the reference signal does not have a deviation).

In some embodiments, compared with the local impedance 30, the impedance value of the external impedance 70 may not have a deviation, that is, the external impedance 70 may be an accurate impedance. Therefore, when the external impedance 70 is used to generate the reference signal, there may be no need to adjust the impedance value of the external impedance 70.

In some embodiments, as shown in FIG. 1, the control circuit 60 includes a memory 66. The memory 66 is connected with the processor 61. The memory 66 stores the impedance target value. The memory 66 may be a volatile storage medium (for example, a random access memory) or a non-volatile storage medium (for example, a read-only memory).

In some embodiments, as shown in FIG. 1, the control circuit 60 includes an adjusting circuit 65. The adjusting circuit 65 is connected with the processor 61 and the local impedance 30. For example, the processor 61 detects the impedance value of the local impedance 30 through the adjusting circuit 65 and obtains the impedance target value from the memory 66. When detecting that the impedance value of the local impedance 30 is not consistent with the impedance target value, the processor 61 generates the correction signal and controls the adjusting circuit 65 to adjust the impedance value of the local impedance 30 in response to the correction signal.

In some embodiments, after the control circuit 60 responds to the correction signal, the control circuit 60 determines to adjust the impedance value of the local impedance 30 by a first adjusting procedure or a second adjusting procedure according to an adjusting instruction. In some embodiments, the adjusting instruction is parsed by the processor 61, and the processor 61 determines, according to a parsing result, whether to control the adjusting circuit 65 to adjust the impedance value of the local impedance 30 by the first adjusting procedure or to control the adjusting circuit 65 to adjust the impedance value of the local impedance 30 by the second adjusting procedure.

In some embodiments, the adjusting instruction may be input to the processor 61 by a user through an input/output interface (not shown). The input/output interface is, for example, but not limited to, a keyboard, a mouse, a touch input unit, or a voice input unit and the like. In some embodiments, the adjusting instruction may be a flag value, and may be prestored in the memory 66 When a logic level of the flag value is "0", it indicates to execute the first adjusting procedure. When the logic level of the flag value is "1", it indicates to execute the second adjusting procedure. However, the present invention is not limited to this. When the logic level of the flag value is "1", it may indicate to execute the first adjusting procedure, and when the logic level of the flag value is "0", it may indicate to execute the second adjusting procedure. Thus, every time after responding to the correction signal, the processor 61 may obtain the flag value as the adjusting instruction directly from the memory 66 to use, and there is no need to input the instruction every time the adjusting instruction is to be used.

In some embodiments, as shown in Table 1, the memory 66 stores a comparison table and a plurality of different levels. The comparison table has the plurality of levels and a plurality of different impedance variations, and the plurality of levels respectively correspond to the plurality of impedance variations. The impedance variation of "+5%" means to increase the impedance value of the local impedance 30 by 5%, and the impedance variation of "-5%" means to reduce the impedance value of the local impedance 30 by 5%.

TABLE 1

| Comparison table | |
|---|---|
| Level | Impedance variation |
| 0 | +5% |
| 1 | +10% |
| 2 | +20% |
| 3 | -5% |
| 4 | -10% |
| 5 | -20% |

Figure 2:
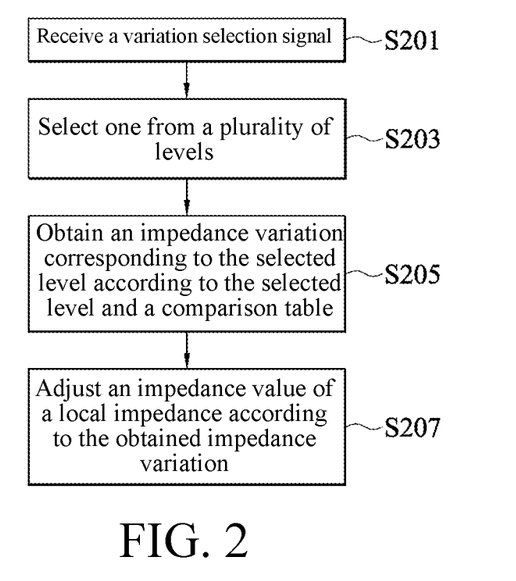
FIG. 2 is a schematic flow chart of a first adjusting procedure according to some embodiments of the present invention.

Referring to FIG. 2, which is a schematic flow chart of the first adjusting procedure according to some embodiments of the present invention. In some embodiments, firstly, the processor 61 receives a variation selection signal (step S201). The variation selection signal is input by the user to the processor 61 through the input/output interface. Next, the processor 61 selects one from the plurality of levels in the memory 66 (step S203). Specifically, the processor 61 selects the level according to the variation selection signal. Afterwards, the processor 61 obtains the impedance variation corresponding to the selected level according to the selected level and the comparison table (step S205). Then, the processor 61 controls the adjusting circuit 65 to adjust the impedance value of the local impedance 30 according to the obtained impedance variation (step S207). For example, if the obtained impedance variation is "+5%", the adjusting circuit 65 increases the impedance value of the local impedance 30 by 5%; and if the obtained impedance variation is "-5%", the adjusting circuit 65 reduces the impedance value of the local impedance 30 by 5%. Thereby, the impedance value of the local impedance 30 is adjusted through the operation of the processor 61, which can simplify the architecture of the integrated circuit 10.

In some embodiments of step S203, the processor 61 selects the one that makes the adjusted impedance value of the local impedance 30 closest or equal to the impedance target value from the levels as the selected level. Thus, the deviation of the local impedance 30 can be corrected to some extent, thereby enhancing the accuracy of the reference signal.

Figure 3:
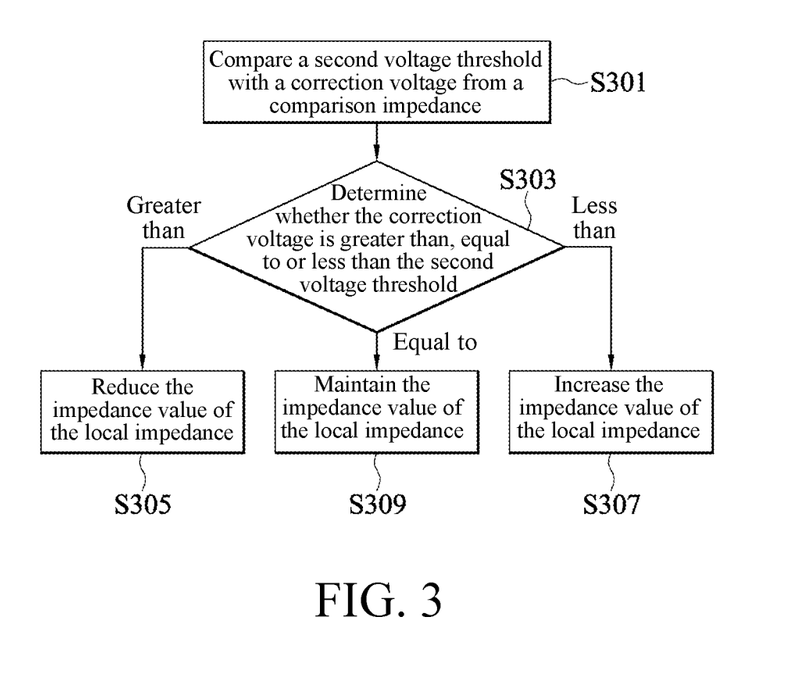
FIG. 3 is a schematic flow chart of a second adjusting procedure according to some embodiments of the present invention.

Referring to FIG. 3, which is a schematic flow chart of the second adjusting procedure according to some embodiments of the present invention. In some embodiments, as shown in FIG. 1, the control circuit 60 includes a second comparator 67. The second comparator 67 is connected with the adjusting circuit 65. The second adjusting procedure is described below. In some embodiments, as shown in FIG. 3, firstly, the second comparator 67 compares a second voltage threshold $V_{T2}$ with a correction voltage $V_{CPK}$ from a comparison impedance 90 (step S301) and outputs a comparison result to the adjusting circuit 65. An impedance value of the comparison impedance 90 may have no deviation, that is, the comparison impedance 90 may be an accurate impedance. The adjusting circuit 65 determines whether the correction voltage $V_{CPK}$ is greater than, equal to or less than the second voltage threshold $V_{T2}$ according to the comparison result (step S303). When the correction voltage $V_{CPK}$ is greater than the second voltage threshold $V_{T2}$, the adjusting circuit 65 reduces the impedance value of the local impedance 30 (step S305). When the correction voltage $V_{CPK}$ is less than the second voltage threshold $V_{T2}$, the adjusting circuit 65 increases the impedance value of the local impedance 30 (step S307). When the correction voltage $V_{CPK}$ is equal to the second voltage threshold $V_{T2}$, the adjusting circuit 65 maintains the impedance value of the local impedance 30 (step S309). Thereby, the impedance value of the local impedance 30 can be corrected automatically, so that the impedance value of the local impedance 30 has no deviation.

In some embodiments of step S309, the adjusting circuit 65 maintains the impedance value of the local impedance 30. At this time, the impedance value of the local impedance 30 is identical to the impedance value of the comparison impedance 90, and the impedance value of the comparison impedance 90 is the impedance target value. In other words, when the correction voltage $V_{CPK}$ is equal to the second voltage threshold $V_{T2}$, the impedance value of the local impedance 30 is the impedance target value.

In some embodiments, due to the variability of the integrated circuit 10, a deviation range of the impedance value of the local impedance 30 in different integrated circuits 10 may be different. The first adjusting procedure is to adjust the impedance value of the local impedance 30 based on a percentage of the impedance value of the local impedance 30. Therefore, in different integrated circuits 10, the impedance value of the local impedance 30 after being adjusted by the first adjusting procedure may be different, which causes the accuracy of the reference signal of different integrated circuits 10 to be different. Compared with the first adjusting procedure, the second adjusting procedure is to adjust the impedance value of the local impedance 30 based on the comparison impedance 90. Therefore, in different integrated circuits 10, the impedance value of the local impedance 30 after being adjusted by the second adjusting procedure may be the same, and the accuracy of the reference signal of different integrated circuits 10 is the same. In other words, an implementation object of the first adjusting procedure may be an application example that does not require high accuracy of the reference signal, and an implementation object of the second adjusting procedure may be an application example that requires high accuracy of the reference signal.

In some embodiments, a first input terminal of the second comparator 67 is connected to the comparison impedance 90 to receive the correction voltage $V_{CPK}$ from the comparison impedance 90, and an output terminal of the second comparator 67 is connected with the adjusting circuit 65 to output the comparison result to the adjusting circuit 65. In some embodiments, the second voltage threshold $V_{T2}$ may be a band gap reference voltage source generated by a band gap reference voltage generating circuit (not shown), and the band gap reference voltage source is connected with a second input terminal of the second comparator 67. In some embodiments, the second voltage threshold $V_{T2}$ is different from the first voltage threshold $V_{T1}$, but the present invention is not limited to this. The second voltage threshold $V_{T2}$ may be identical to the first voltage threshold $V_{T1}$.

Figure 4:
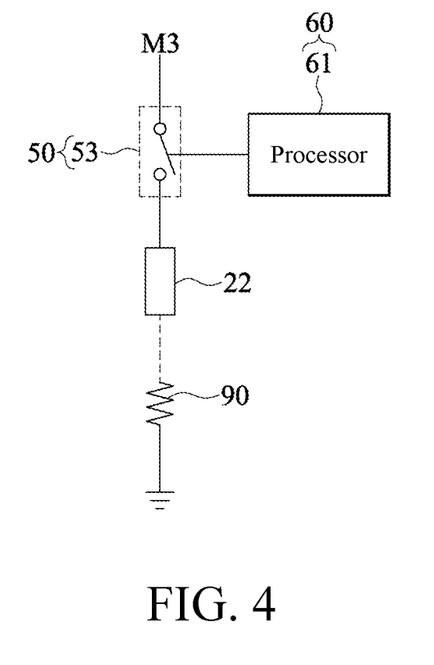
FIG. 4 is a schematic diagram of a part of an integrated circuit according to some embodiments of the present invention.

Referring to FIG. 4, which is a schematic diagram of a part of the integrated circuit 10 according to some embodiments of the present invention In some embodiments, as shown in FIG. 1, the integrated circuit 10 is implemented by a chip. The comparison impedance 90 is located inside the chip. That is, the external impedance 70 is located outside the chip, the input/output pin 20 is an input/output pin of the chip, and other components in the integrated circuit 10 may be located inside the chip. However, the present invention is not limited to this. In other embodiments, as shown in FIG. 4, the integrated circuit 10 further includes another input/output pin 22 provided for a connection to the comparison impedance 90. At this time, when the integrated circuit 10 is implemented by the chip, the comparison impedance 90 and the external impedance 70 are located outside the chip, the input/output pin 20 and the input/output pin 22 are the input/output pins of the chip, and other components in the integrated circuit 10 may be located inside the chip.

In some embodiments, the comparison impedance 90 may be formed by a passive component such as a resistor, a capacitor, an inductor and the like. In a preferred embodiment, the comparison impedance 90 may be a resistor. Although the comparison impedance 90 is respectively represented by only one resistor symbol in FIG. 1 and FIG. 4, the present invention is not limited to this. The comparison impedance may include a plurality of resistors in series and/or in parallel according to actual design requirements.

Referring to FIG. 1 again, in some embodiments, the integrated circuit 10 includes a third transistor M3. The switching circuit 50 is connected between the comparison impedance 90 and the third transistor M3. When the switching circuit 50 is controlled into the second state and the second adjusting procedure is executed, the switching circuit 50 conducts a connection between the comparison impedance 90 and the third transistor M3, such that the comparison impedance 90 generates the correction voltage $V_{CPK}$ according to a current $I_3$ of the third transistor M3. The third transistor M3 may be a P-type MOS transistor or a P-type bipolar transistor The description is made by taking the third transistor M3 as a P-type bipolar transistor. For example, the switching circuit 50 includes a switch 53. The switch 53 is connected between the comparison impedance 90 and a collector of the third transistor M3 and controlled by the processor 61. In the second state, when the second adjusting procedure is executed, the processor 61 sends a conduction signal, and the switch 53 conducts the connection between the comparison impedance 90 and the third transistor M3 in response to the conduction signal. In the first state, the processor 61 sends a breaking signal, and the switch 53 breaks (does not conduct) the connection between the comparison impedance 90 and the third transistor M3 in response to the breaking signal. When the connection between the comparison impedance 90 and the collector of the third transistor M3 is conducted, the collector of the third transistor M3 generates the current $I_3$, and the comparison impedance 90 generates the correction voltage $V_{CPK}$ according to the current $I_3$. For example, the correction voltage $V_{CPK}$ is equal to or approximate to a value obtained by multiplying the current $I_3$ by the impedance value of the comparison impedance 90. In some embodiments, the switch 53 may be implemented by an electronic switch (for example, a transistor).

In some embodiments, similar to the switch 53, the conduction and breaking actions of the switches 51-52 are controlled by the processor 61. In some embodiments, the comparison impedance 90 is further connected with the ground terminal. For example, a first terminal of the comparison impedance 90 is connected with the ground terminal, and a second terminal of the comparison impedance 90 is connected with the switching circuit 50. In other words, the comparison impedance 90 is connected between the switching circuit 50 and the ground terminal.

In some embodiments, the memory 66 stores a temporary storage value. The temporary storage value is configured to indicate whether to detect the input/output pin 20. For example, the temporary storage value may be implemented by a flag value. When the logic level of the flag value is "0", it indicates to detect the input/output pin 20. When the logic level of the flag value is "1", it indicates not to detect the input/output pin 20. However, the present invention is not limited to this. When the logic level of the flag value is "0", it may indicate not to detect the input/output pin 20. When the logic level of the flag value is "1", it may indicate to detect the input/output pin 20.

The control circuit 60 determines whether to generate the detection signal DT according to the indication of the temporary storage value. When the temporary storage value indicates not to detect the input/output pin 20, the control circuit 60 does not generate the detection signal DT, and controls the switching circuit 50 into the first state. When the temporary storage value indicates to detect the input/output pin 20, the control circuit 60 detects whether the input/output pin 20 is connected to the external impedance 70 and generates the detection signal DT. For example, when the temporary storage value indicates not to detect the input/output pin, the processor 61 controls the switching circuit 50 into the first state, and the first comparator 62 stops detecting the detection current $I_{DET}$ on the path between the pull-down impedance 63 and the voltage divider circuit 64 and stops detecting the variation of the detection voltage $V_{DET}$. When the temporary storage value indicates to detect the input/output pin 20, the first comparator 62 detects whether the path between the pull-down impedance 63 and the voltage divider circuit 64 has the detection current $I_{DET}$, and detects the variation of the detection voltage $V_{DET}$.

In some embodiments, the temporary storage value may be input to the memory 66 by the user through the input/output interface (not shown). In some embodiments, the temporary storage value may be preset to indicate to detect the input/output pin 20. In some cases, the user may know in advance that the input/output pin has been connected to the external impedance 70, so as to input the temporary storage value that indicates not to detect the input/output pin 20 into the memory 66. Thus, the load of the integrated circuit 10 can be saved. For example, the first comparator 62 may not need to detect the detection current $I_{DET}$ and the detection voltage $V_{DET}$.

In some embodiments, the adjusting circuit 65 includes a plurality of transistors, and the transistors are respectively connected in parallel with the local impedance 30. The description is made by taking the transistors as P-type bipolar transistors. The adjusting circuit 65 varies impedance values of the transistors by varying voltages of bases of the transistors, thereby adjusting the impedance value of the local impedance 30. When the impedance value of the local impedance 30 is to be increased, the adjusting circuit 65 reduces the voltages of the bases of the transistors to increase the impedance values of the transistors, so that the impedance value of the local impedance 30 can be increased. When the impedance value of the local impedance 30 is to be reduced, the adjusting circuit 65 increases the voltages of the bases of the transistors to decrease the impedance values of the transistors, so that the impedance value of the local impedance 30 can be reduced.

In some embodiments, the reference power circuit 40 may be a low-dropout regulator. In some embodiments, as shown in FIG. 1, the reference power circuit 40 includes an operational amplifier 41 and a fourth transistor M4. An output terminal of the operational amplifier 41 is connected with the fourth transistor M4. The description is made by taking the fourth transistor M4 as an N-type bipolar transistor. The fourth transistor M4 is configured to generate the reference current $I_{ref}$ (that is, the reference signal) according to the voltage of its base. When the switching circuit 50 is controlled into the first state, the operational amplifier 41 obtains a feedback voltage $V_{FB}$ according to the reference current $I_{ref}$ and the external impedance 70. When the switching circuit 50 is controlled into the second state, the operational amplifier 41 obtains the feedback voltage $V_{FB}$ according to the reference current $I_{ref}$ and the local impedance 30. The operational amplifier 41 controls the voltage of the base of the fourth transistor M4 according to a comparison voltage $V_{BG}$ and the feedback voltage $V_{FB}$, so that the reference current $I_{ref}$ is stably maintained at a current level. For example, when the reference current $I_{ref}$ decreases due to some conditions, the operational amplifier 41 increases the voltage of the base of the fourth transistor M4 to increase the reference current $I_{ref}$. When the reference current $I_{ref}$ increases due to some conditions, the operational amplifier 41 reduces the voltage of the base of the fourth transistor M4 to reduce the reference current $I_{ref}$, so that the reference current $I_{ref}$ can be stably maintained at a current level.

In some embodiments, when the switching circuit 50 is controlled into the first state, the feedback voltage $V_{FB}$ is equal to or approximate to a value obtained by multiplying the reference current $I_{ref}$ by the impedance value of the external impedance 70. When the switching circuit 50 is controlled into the second state, the feedback voltage $V_{FB}$ is equal to or approximate to a value obtained by multiplying the reference current $I_{ref}$ by the impedance value of the local impedance 30.

In some embodiments, the comparison voltage $V_{BG}$ may be a band gap reference voltage source generated by a band gap reference voltage generating circuit (not shown). In some embodiments, the comparison voltage $V_{BG}$ may be different from one or both of the first voltage threshold $V_{T1}$ and the second voltage threshold $V_{T2}$, but the present invention is not limited to this. The comparison voltage $V_{BG}$ may be identical to one or both of the first voltage threshold $V_{T1}$ and the second voltage threshold $V_{T2}$.

In some embodiments, as shown in FIG. 1, the integrated circuit 10 includes a fifth transistor M5 and a sixth transistor M6. The fifth transistor M5 is connected with the first transistor M1, the second transistor M2, the third transistor M3, the fourth transistor M4 and the sixth transistor M6. The first transistor M1 is connected with the input/output pin 20. The second transistor M2 is connected with the pull-down impedance 63 and the first comparator 62. The sixth transistor M6 is connected with the reference power drawing circuit 80. The fifth transistor M5 is configured to output the reference current $I_{ref}$ (that is, the reference signal) obtained from the fourth transistor M4 respectively to the first transistor M1, the second transistor M2, the third transistor M3 and the sixth transistor M6. Thus, the first transistor M1, the second transistor M2, the third transistor M3 and the sixth transistor M6 can respectively generate currents (for example, the output current Ii of the first transistor M1, the detection current $I_{DET}$ of the second transistor M2, the current $I_3$ of the third transistor M3 and the current $I_6$ of the sixth transistor M6).

In some embodiments, the fifth transistor M5 may form a current mirror circuit respectively with the first transistor M1, the second transistor M2, the third transistor M3 and the sixth transistor M6 to ensure that ratios of the reference current $I_{ref}$ to the output current $I_1$ of the first transistor M1, the detection current $I_{DET}$ of the second transistor M2, the current $I_3$ of the third transistor M3 and the current $I_6$ of the sixth transistor M6 are fixed or settable. For example, if the current mirror circuit is an adjustable current mirror, the ratios are settable. Specifically, the description is made by taking the first transistor M1, the second transistor M2, the third transistor M3, the fifth transistor M5 and the sixth transistor M6 as N-type bipolar transistors. A base of the first transistor M1, a base of the second transistor M2, a base of the third transistor M3, a base of the fifth transistor M5 and a base of the sixth transistor M6 respectively receive the bias voltage $V_{bias}$ from the bias circuit (not shown), so that the operation of the first transistor M1, the second transistor M2, the third transistor M3, the fifth transistor M5 and the sixth transistor M6 is started The operation is, for example, to start to generate the current and start to transmit the current. A collector of the fifth transistor M5 is connected with the base of the first transistor M1, the base of the second transistor M2, the base of the third transistor M3, the base of the fifth transistor M5 and the base of the sixth transistor M6, so that the fifth transistor M5 forms the current mirror circuit respectively with the first transistor M1, the second transistor M2, the third transistor M3 and the sixth transistor M6.

It is worth noting that the transistors herein can be implemented by N-type MOS transistors, N-type bipolar transistors, P-type MOS transistors or P-type bipolar transistors. When the transistors are implemented in a different manner from the foregoing embodiments, how to properly adjust the architecture of the integrated circuit 10 can be deduced according to the disclosure of the present invention.

Based on the above, according to some embodiments, the external impedance or the local impedance is selected to generate the reference signal, so that the generation of the reference signal may not be limited to a single manner. In some embodiments, the external impedance may be selected to generate the reference signal when the input/output pin is connected to the external impedance, so the area required by the circuit design of the integrated circuit can be reduced, and the manufacturing cost can be reduced In some embodiments, the local impedance may be used to generate the reference signal, so the probability that the reference power is disturbed by noise can be reduced.

What is claimed is:

1. An integrated circuit with self-reference impedance, comprising:
    an input/output pin, provided for connection to an external impedance;
    a local impedance;
    a reference power circuit;
    a switching circuit, connected between the input/output pin, the local impedance and the reference power circuit, and configured to conduct a connection between the input/output pin and the reference power circuit in a first state and to conduct a connection between the local impedance and the reference power circuit in a second state; and
    a control circuit, configured to
        detect whether the input/output pin is connected to the external impedance or not and to generate a detection signal; and
        control the switching circuit into the first state or the second state according to the detection signal;
    wherein when the switching circuit is controlled into the first state, the reference power circuit generates a reference signal according to the external impedance, and when the switching circuit is controlled into the second state, the reference power circuit generates the reference signal as a reference power of the integrated circuit according to the local impedance.

2. The integrated circuit with self-reference impedance according to claim 1, wherein the control circuit generates the detection signal indicating the first state and controls the switching circuit into the first state when detecting that the input/output pin is connected to the external impedance, and the control circuit generates the detection signal indicating the second state and controls the switching circuit into the second state when detecting that the input/output pin is not connected to the external impedance.

3. The integrated circuit with self-reference impedance according to claim 2, wherein the control circuit comprises a first comparator and a pull-down impedance, the first comparator is connected with the input/output pin and the pull-down impedance, and the first comparator is configured to compare a detection voltage with a first voltage threshold to generate the detection signal, wherein the detection voltage varies according to the external impedance and the pull-down impedance.

4. The integrated circuit with self-reference impedance according to claim 3, wherein when the input/output pin is connected to the external impedance, the detection voltage is greater than the first voltage threshold.

5. The integrated circuit with self-reference impedance according to claim 4, wherein the control circuit further comprises a voltage divider circuit connected with the input/output pin, the first comparator and the pull-down impedance, the voltage divider circuit is configured to generate a detection current according to the external impedance when the input/output pin is connected to the external impedance, and the pull-down impedance generates the detection voltage greater than the first voltage threshold according to the detection current.

6. The integrated circuit with self-reference impedance according to claim 5, wherein the voltage divider circuit comprises:
    a first transistor, configured to generate an output current according to the external impedance when the input/output pin is connected to the external impedance; and
    a second transistor, configured to generate the detection current according to the output current.

7. The integrated circuit with self-reference impedance according to claim 3, wherein the detection voltage is pulled down by the pull-down impedance to be not greater than the first voltage threshold when the input/output pin is not connected to the external impedance.

8. The integrated circuit with self-reference impedance according to claim 1, wherein the control circuit adjusts an impedance value of the local impedance in response to a correction signal when the switching circuit is controlled into the second state.

9. The integrated circuit with self-reference impedance according to claim 8, wherein the control circuit generates the correction signal when the impedance value is not consistent with an impedance target value.

10. The integrated circuit with self-reference impedance according to claim 8, wherein the control circuit determines to adjust the impedance value by a first adjusting procedure or a second adjusting procedure according to an adjusting instruction.

11. The integrated circuit with self-reference impedance according to claim 10, wherein the control circuit comprises a memory, the memory stores a comparison table and a plurality of different levels, the comparison table has the plurality of levels and a plurality of different impedance variations, and the plurality of levels respectively correspond to the plurality of impedance variations, the first adjusting procedure comprises:
 selecting one of the plurality of levels;
 obtaining the impedance variation corresponding to the selected level according to the selected level and the comparison table; and
 adjusting the impedance value according to the obtained impedance variation.

12. The integrated circuit with self-reference impedance according to claim 11, wherein the step of selecting the level is to select the one that makes the adjusted impedance value closest or equal to an impedance target value from the levels as the selected level.

13. The integrated circuit with self-reference impedance according to claim 10, wherein the control circuit comprises a second comparator and an adjusting circuit, and the second adjusting procedure comprises:
 comparing, by the second comparator, a second voltage threshold with a correction voltage from a comparison impedance;
 reducing, by the adjusting circuit, the impedance value when the correction voltage is greater than the second voltage threshold; and
 increasing, by the adjusting circuit, the impedance value when the correction voltage is less than the second voltage threshold.

14. The integrated circuit with self-reference impedance according to claim 13, wherein the second adjusting procedure further comprises: maintaining, by the adjusting circuit, the impedance value when the correction voltage is equal to the second voltage threshold.

15. The integrated circuit with self-reference impedance according to claim 13, further comprising a third transistor, wherein the switching circuit is connected between the comparison impedance and the third transistor, and the switching circuit conducts a connection between the comparison impedance and the third transistor when the switching circuit is controlled into the second state and the second adjusting procedure is executed, such that the comparison impedance generates the correction voltage according to a current of the third transistor.

16. The integrated circuit with self-reference impedance according to claim 1, wherein the control circuit comprises a memory, the memory stores a temporary storage value, the temporary storage value is configured to indicate whether to detect the input/output pin or not, and the control circuit determines whether to generate the detection signal or not according to the indication of the temporary storage value.

17. The integrated circuit with self-reference impedance according to claim 16, wherein the control circuit does not generate the detection signal and controls the switching circuit into the first state when the temporary storage value indicates not to detect the input/output pin.

18. The integrated circuit with self-reference impedance according to claim 16, wherein the control circuit detects whether the input/output pin is connected to the external impedance or not and generates the detection signal when the temporary storage value indicates to detect the input/output pin.

\* \* \* \* \*